United States Patent
Jain

(10) Patent No.: US 9,397,693 B1
(45) Date of Patent: Jul. 19, 2016

(54) ASYNCHRONOUS ANALOG-TO-DIGITAL CONVERTER

(71) Applicant: Texas Instruments Incorporated, Dallas, TX (US)

(72) Inventor: Dinesh Jain, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/926,320

(22) Filed: Oct. 29, 2015

(51) Int. Cl.
*H03M 3/00* (2006.01)
*H03M 1/52* (2006.01)
*H03M 3/04* (2006.01)

(52) U.S. Cl.
CPC ........ *H03M 3/49* (2013.01); *H03M 1/52* (2013.01); *H03M 3/04* (2013.01); *H03M 3/496* (2013.01)

(58) Field of Classification Search
USPC .......................................... 341/143, 164–165
See application file for complete search history.

(56) References Cited

U.S. PATENT DOCUMENTS

| 3,795,900 | A | * | 3/1974 | Monford, Jr. | H03M 3/02 341/143 |
| 5,122,800 | A | * | 6/1992 | Philipp | H03M 1/462 341/122 |
| 7,453,381 | B2 | * | 11/2008 | Doerrer | H03M 3/424 341/143 |
| 8,358,231 | B2 | * | 1/2013 | Killat | H03M 1/125 341/165 |
| 8,704,695 | B2 | * | 4/2014 | Liu | H03M 1/34 341/158 |
| 9,258,008 | B2 | * | 2/2016 | Singh | H03M 1/462 |

* cited by examiner

*Primary Examiner* — Howard Williams
(74) *Attorney, Agent, or Firm* — John R. Pessetto; Frank D. Cimino

(57) ABSTRACT

An asynchronous analog-to-digital converter (AADC) and a method of using the AADC are shown. The AADC includes a digital-to analog-converter (DAC), a continuous-time comparator that provides an output including a digital value of the DAC and a time value, and a first and a second continuous-time summer, each connected to receive an analog differential input on a first input, to receive a differential output of the DAC on a second input, and to provide a difference between the analog input and the output of the DAC to the continuous-time comparator and to an error estimator. The continuous-time comparator provides the output responsive to the difference between the analog input and the output of the DAC being zero.

20 Claims, 9 Drawing Sheets

ASYNCHRONOUS ANALOG-TO-DIGITAL CONVERTER

FIELD OF THE DISCLOSURE

Disclosed embodiments relate generally to the field of analog-to-digital converters (ADCs). More particularly, and not by way of any limitation, the present disclosure is directed to a new architecture for an asynchronous ADC.

BACKGROUND

A wide variety of Analog to Digital Converters (ADC) is available for different applications at varied sampling rates and resolutions, including both synchronous and asynchronous ADCs. Synchronous ADC are driven by a global clock and sample the signal at regular intervals, while Asynchronous ADC are clockless. Asynchronous ADC (AADC) can be sub-categorized in two categories: asynchronous logic type and asynchronous analog type. In the asynchronous logic type ADC, the input is sampled at regular intervals. But, the time to convert the input analog quantity into digital quantity is generally asynchronous. In the asynchronous analog type of ADC, the input is not sampled; rather the continuous time input is compared continuously with a reference quantity. In this type of ADC, the Input-Output (I/O) can be truly asynchronous, although the asynchronous output can be further re-timed so that digital interface is synchronous.

SUMMARY

The present patent application discloses a new architecture for an AADC. An analog differential input is connected to a first input of respective continuous-time summers, with the second input of the continuous-time summers connected to a differential signal from a voltage Digital-to-Analog Converter (DAC). The output of each summer is a continuous-time difference of the respective analog input and DAC output. The zero-crossing of the summers' output is detected by a continuous-time comparator, whose asynchronous output is a two-tuple that includes the DAC code at zero crossing time and the time at which zero-crossing occurred. The summer output is also monitored using an error estimator. If the analog input is equal to the DAC output, the DAC code is a true representation of the analog input, with an error of zero. However, this error would be zero only at zero crossings of the summer output. The error estimator is used to check the maximum error between the analog input and the DAC. As soon as the error estimator detects the breach of an upper bound of error, it signals a decision block to generate control and enable signals to control appropriate circuitry. These signals are used to change the DAC code in such a way that a zero-crossing is forced at the output of the summer. Since the DAC code is changed in such way as to track the input signal, the total error at the output of the summer is restored within the upper bound, also called the tracking error.

In one aspect, an embodiment of an asynchronous analog-to-digital converter (AADC) is disclosed. The AADC includes a digital-to analog-converter (DAC); a continuous time comparator that provides an output comprising a digital value of the DAC and a time value; and a first and a second continuous time summer each connected to receive an analog differential input on a first input, to receive a differential output of the DAC on a second input, and to provide a difference between the analog input and the output of the DAC to the continuous time comparator and to an error estimator; wherein the continuous time comparator provides the output responsive to the difference between the analog input and the output of the DAC being zero.

In yet another aspect, an embodiment of a method of operating an asynchronous analog-to-digital converter (AADC) is disclosed. The method includes subtracting a differential output of a digital-to-analog converter (DAC) from an analog differential input signal at a summer to provide differential difference signals to first and second inputs of a continuous-time comparator; determining whether the differential difference signals are equal, responsive to the differential difference signals being equal, outputting a current value of the DAC and a time stamp; tracking one of the differential difference signals to determine a maximum error; and incrementing the value of the DAC based on the maximum error.

Advantages of the disclosed AADC and method include the following:
  More Effective Number of Bits (ENOB) than conventional ADC;
  Significant amount of power is used to drive the Sample and Hold (S/H) input of most ADC; in the disclosed AADC, the S/H is removed; and
  Activity dependent signal power, with lower power usage when signal is not changing.

BRIEF DESCRIPTION OF THE DRAWINGS

Embodiments of the present disclosure are illustrated by way of example, and not by way of limitation, in the Figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing Figures in which:

DETAILED DESCRIPTION OF THE DRAWINGS

Specific embodiments of the invention will now be described in detail with reference to the accompanying Figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 1A:
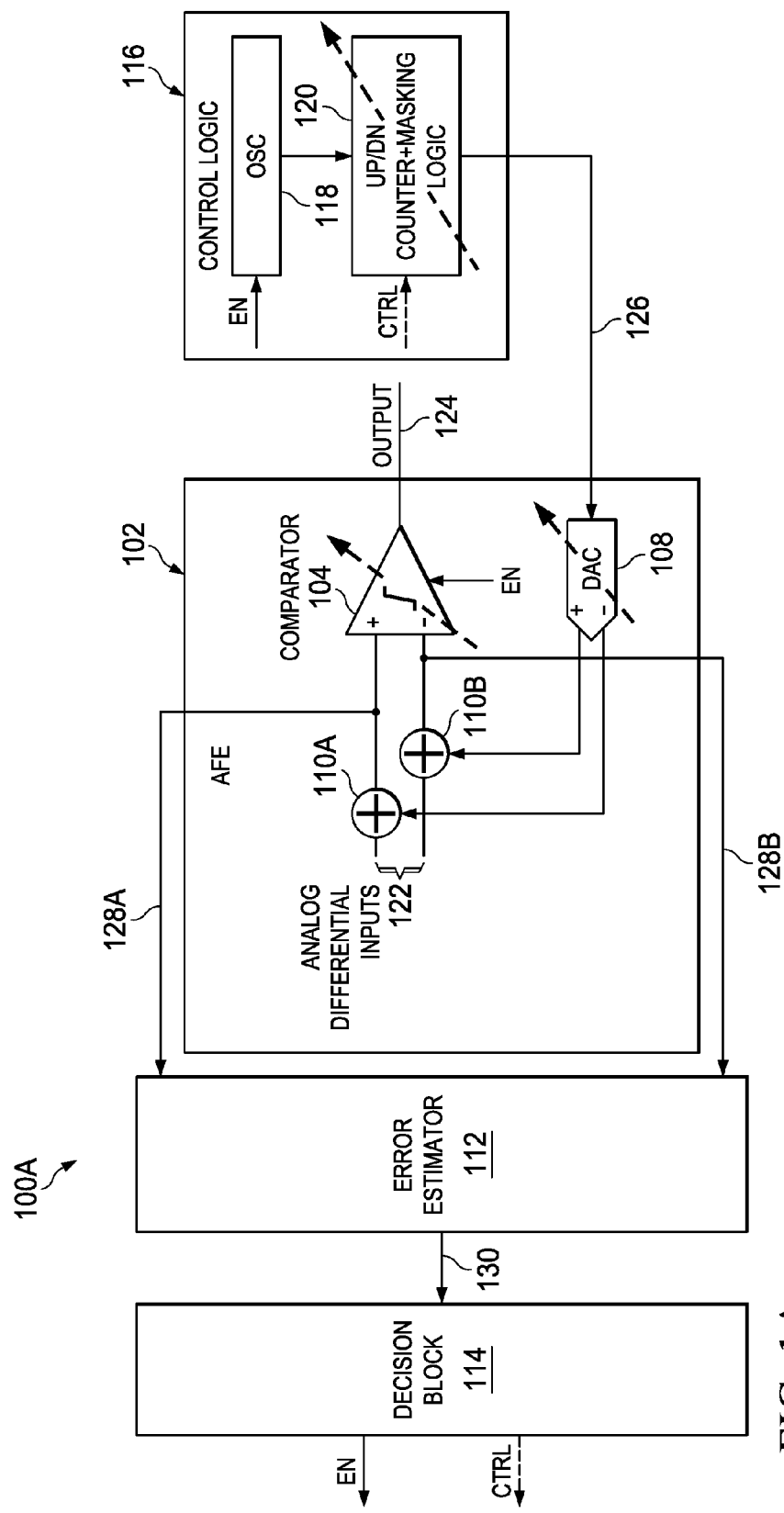
FIG. 1A depicts an example of an asynchronous ADC according to an embodiment of the disclosure.

Referring now to the drawings and more particularly to FIG. 1A, a generalized example ADC 100A is disclosed according to an embodiment of the disclosure. ADC 100A includes Asynchronous Front End (AFE) 102, which receives an analog differential input 122 and outputs an asynchronous digital output 124. AFE 102 receives a control signal 126 from Control Logic module 116 and provides a differential error signal 128 to Error Estimator 112, as will be discussed below. Error Estimator 112 sends a signal 130 to Decision Block 114, while Decision Block 114 provides enable signal EN and control signal CTRL to Control Logic module 116.

AFE 102 includes DAC 108, Continuous-Time Summers 110A, 110B and Continuous-Time Comparator 104. Each Continuous-Time Summer 110A, 110B receives an analog differential input 122 at a first input and a differential value of voltage DAC 108 at a second input. The output of each Continuous-Time Summer 110A, 110B is a continuous-time difference of the analog input and DAC 108 output, which is provided to Continuous-Time Comparator 104. When Continuous-Time Comparator 104 detects a zero-crossing of the output of Continuous-Time Summers 110A, 110B, Continuous-Time Comparator 104 outputs a two-tuple comprising the DAC code at zero crossing time and the time at which zero-crossing occurred.

The output 128A, 128B of Continuous-Time Summers 110A, 110B is also provided to Error Estimator 112. If analog input 122 is equal to the DAC output, the DAC code is a true representation of the analog input and the error is zero. However, this error would be zero only at zero crossings of Continuous-Time Summer 110 output 128. Error Estimator 112 is used to track the maximum error between analog input 122 and the output of DAC 108. As soon as Error Estimator 112 detects the breach of an upper bound of error, Error Estimator 112 signals Decision Block 114 to generate appropriate CTRL and EN signals to control appropriate circuitry.

Control Logic module 116 contains Oscillator 118, which receives the enable signal EN, and UP/DN Counter and Masking Logic 120 (hereinafter simply UP/DN Counter 120), which receives the control signal CTRL. The EN and CTRL signals are used to change the DAC Code in such a way that a zero-crossing is forced at the output of the Continuous-Time Summer, as will be explained in greater detail below. It will be understood that this generalized embodiment is provided in order to explain the functionality of the asynchronous ADC and does not limit the specific embodiments. As will be seen as specific implementations are discussed below, the functionality of a given block of the block diagram may be separated into multiple blocks and/or the functionality of two or more blocks of the block diagrams may be at least partially integrated. Additionally, other blocks may be added/inserted between the blocks that are illustrated.

Figure 1B:
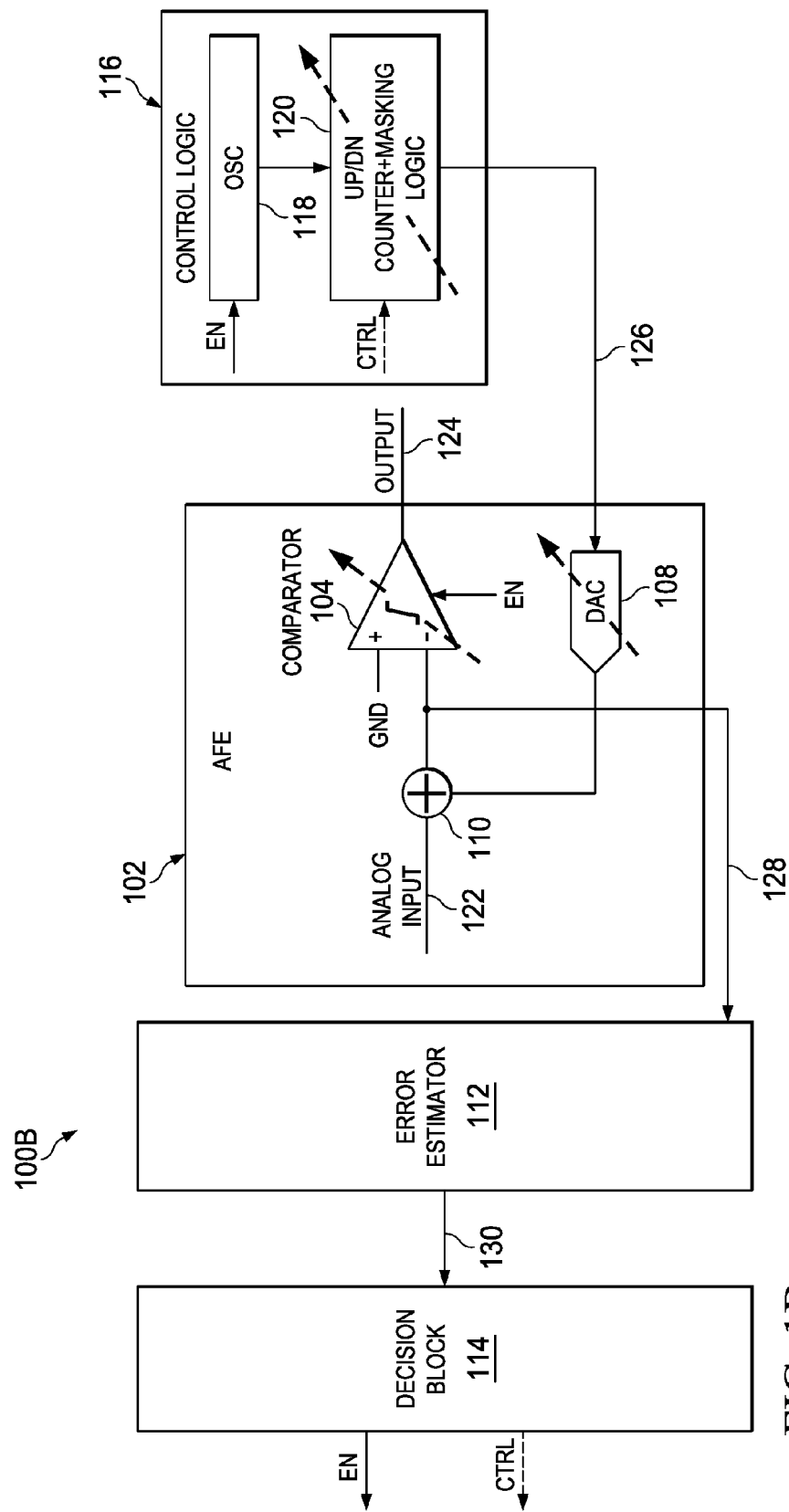
FIG. 1B depicts an example of an asynchronous ADC according to an embodiment of the disclosure.

The embodiment shown in FIG. 1A includes differential inputs, although this is not necessary to the operation of the ADC, as shown in FIG. 1B. The embodiment of FIG. 1B is generally identical to the embodiment of FIG. 1A, except where specifically noted below. In ADC 100B, a single Continuous-Time Summer 110 receives single-ended Analog Input 122 at a first input and a value of voltage DAC 108 at a second input. The output of Continuous-Time Summer 110 is a continuous-time difference of the analog input and DAC 108 output and is provided to Continuous-Time Comparator 104 on the non-inverting input. The inverting input of Continuous-Time Comparator 104 receives a reference value, which in this embodiment is ground. The rest of the circuit remains the same. It will be understood that both differential inputs and single-ended inputs may be used with specific embodiments shown below.

Figure 2:
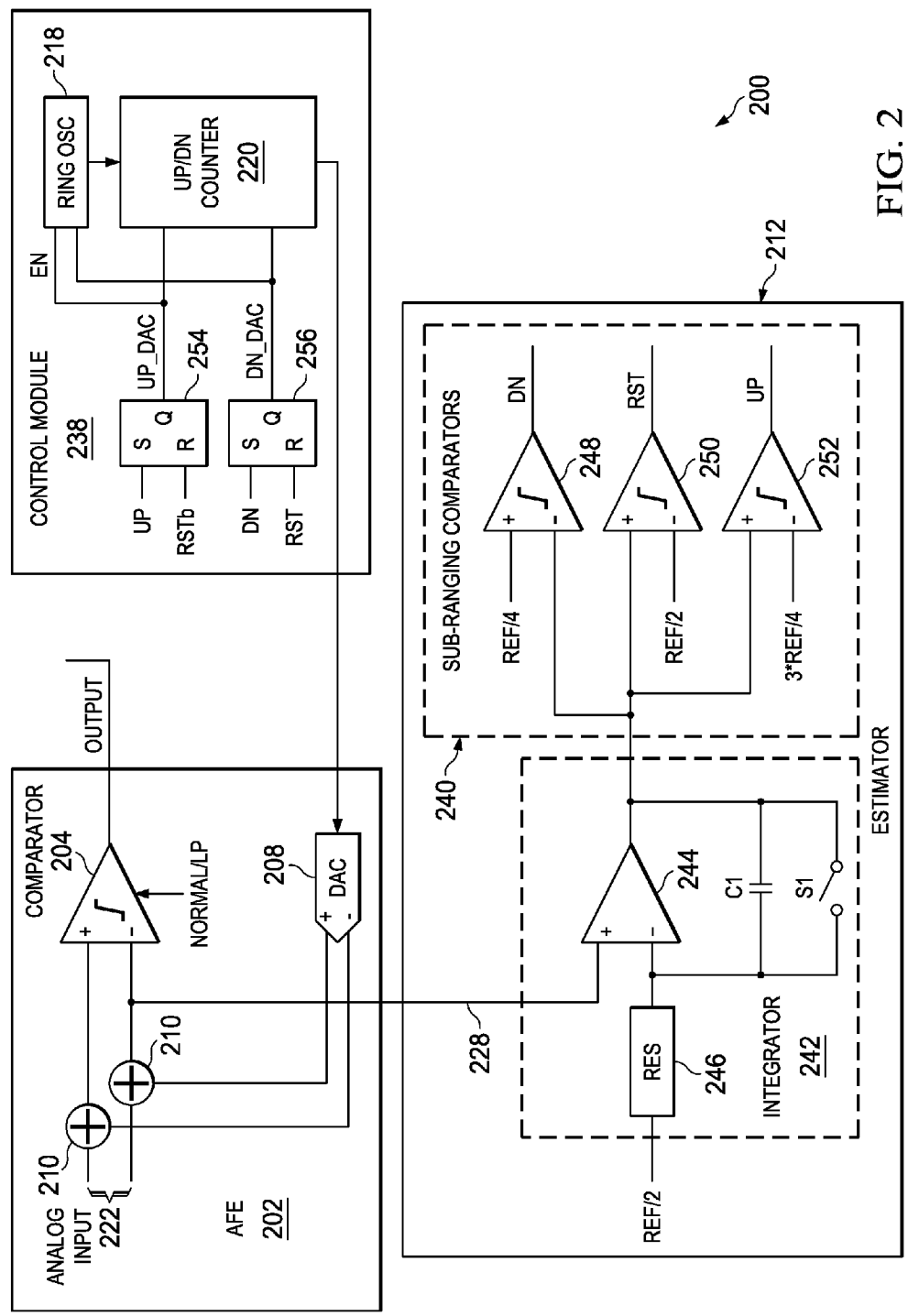
FIG. 2 depicts an example of an asynchronous ADC according to an embodiment of the disclosure.

Turning next to FIG. 2, an example implementation is shown according to an embodiment of the disclosure. In this embodiment, ADC 200 includes AFE 202, Estimator 212 and Control Module 238. AFE includes Continuous-Time Summers 210, which are connected to receive analog differential inputs 222 and the differential outputs of DAC 208 and to provide differential outputs to the input nodes of Continuous-Time Comparator 204. As in the previous example, the differential output of continuous time summer 210 is compared using Continuous-Time Comparator 204 to provide asynchronous output 224. The DAC code for DAC 208 is controlled through UP/DN Counter 220. When analog differential input 222 is equal to the differential output of DAC 208, the inputs to Continuous-Time Comparator 204 are at common mode, i.e., REF/2. Since both of analog differential signals 222 include common mode voltage, Continuous-Time Comparator 204 will see the comparison as a zero crossing and provide an output that includes the DAC value and a time stamp. Continuous-Time Comparator 204 can be operated either at normal power mode or low-power mode; this setting is controlled through control module 238.

The output of Continuous-Time Summer 210 is provided to Estimator 212 through Error Signal 228, which is received at Integrator 242. Integrator 242 integrates Error Signal 228, i.e., sums the signal over time. Integrator 242 includes Amplifier 244, which receives Error Signal 228 on a non-inverting input and receives REF/2 via resistor 246 on an inverting input. The output and the inverting input of Amplifier 244 are connected in parallel with Capacitor C1 and Switch S1 to form Integrator 242. Initially, the output of the integrator would be a common mode. As the signal starts moving, the error is integrated and provided to Sub-Ranging Comparators 240.

Sub-Ranging Comparators 240 includes Comparators 248, 250, 252, which each receive the integrated error signal on one input and one of reference voltages REF/4, REF/2, 3*REF/4 on the other input. When Comparator 248 detects that the integrated error has crossed the lower threshold, e.g., REF/4, a DN signal is sent to Control Module 238. Similarly, when Comparator 252 detects that the integrated error has crossed the upper threshold, e.g., 3*REF/4, an UP signal is sent to Control Module 238. When Comparator 250 detects that the integrated error signal has crossed common mode voltage REF/2, a reset signal RST is sent to Control Module 238.

Control Module 238 includes Ring Oscillator 218 and UP/DN Counter 220, which correspond to modules 118 and 120 of FIG. 1, and Flip-Flops 254 and 256. Flip-Flop 254 receives the UP signal on an S input when the integrated error crosses the 3*REF/4 threshold and receives reset signal RSTb on an R input when the integrated error crosses REF/2. Flip-Flop 256 receives the DN signal on an S input when the integrated error crosses the REF/4 threshold and receives reset signal RST on an R input when the integrated error crosses REF/2. The outputs from Flip-Flops 254, 256 are each sent to both Ring Oscillator 218 and UP/DN Counter 220, where these two signals together act as enable signal EN and control signal CTRL.

Ring Oscillator 218 has low activity when analog differential input 222 is not changing, so power consumption in this module is related to the signal activity. When activated, the polarity of UP/DN counter 220 is decided in dependence on the signal received, either UP_DAC or DN_DAC, and UP/DN Counter 220 starts a free running operation, incrementing of decrementing DAC 208 at every clock. The output of DAC 208 behaves like a linear ramp. Operation of Ring Oscillator 218 and UP/DN Counter 220 continues until the RST signal has been generated. The clock of UP/DN Counter 220 is generated through Ring Oscillator 218. In at least one embodiment, various blocks of ADC 200 can be powered-down or pre-emptively powered up to reduce power consumption. These actions can be based on the outputs of Sub-Ranging Comparators 200, i.e., Up/Down/RST. In one embodiment, when the tracking error is low, Comparator 204 can be configured into low power mode. As the tracking error crosses an upper or lower bound of error, Comparator 204 wakes up to compare the zero crossing of the output of Summer 210. After the asynchronous output is obtained, the comparator enters into low power mode.

Figure 3:
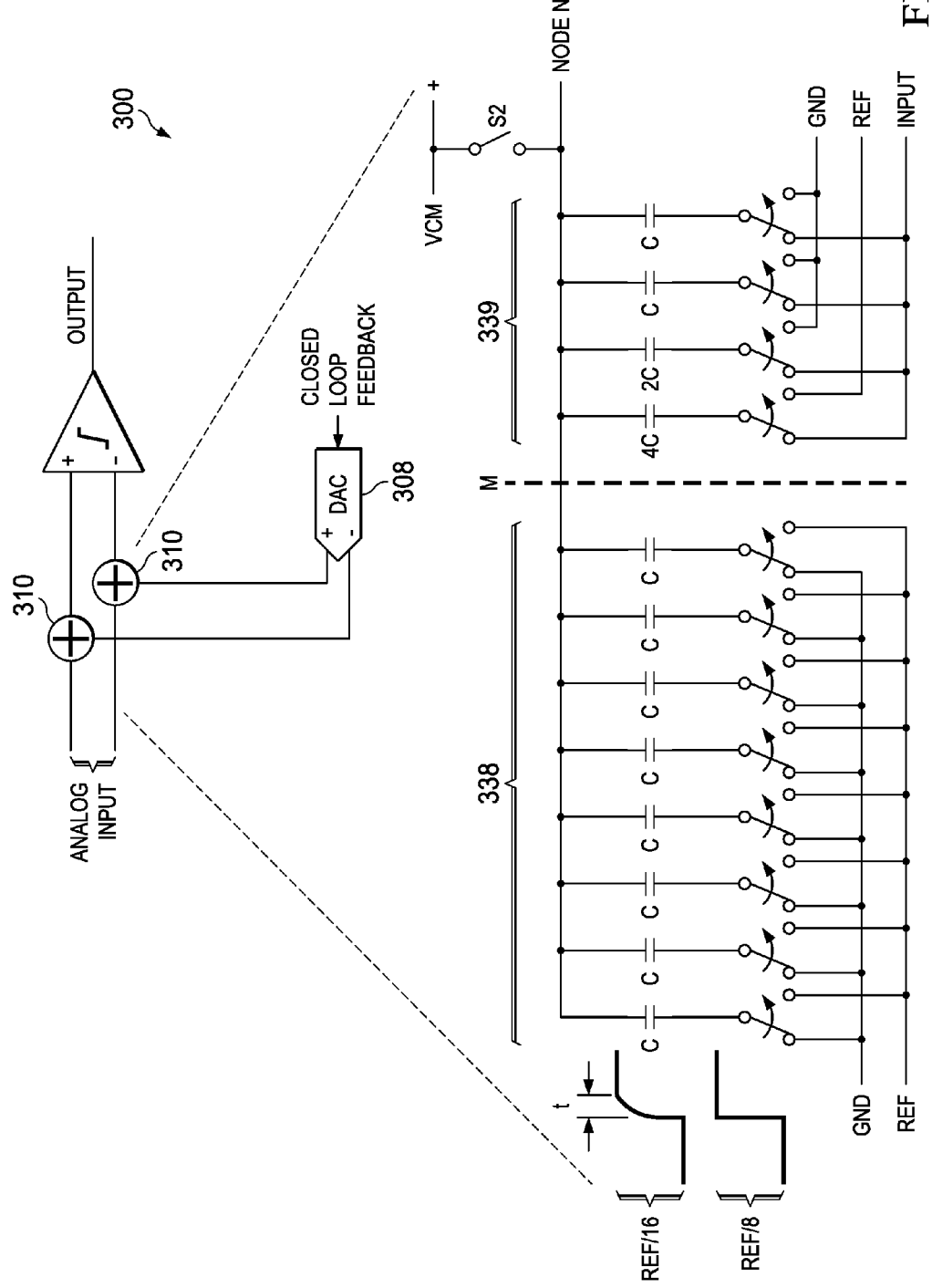
FIG. 3 depicts a structure that provides the functionality of a continuous-time summer and a DAC.

FIG. 3 discloses one embodiment of AFE 102 in which DAC 108 and Continuous-Time Summer 110 are integrated into a single structure 300. In this figure, structure 300 is visually broken into two sections by dotted line M. To the left of dotted line M are eight capacitors 338, each having a capacitance value of C; capacitors 338 implement the DAC, which is controlled through the DAC code sent as signal 126. The lower plates of capacitors 338 are each separately connectable to either ground (GND) or to the reference voltage (REF). To the right of dotted line M are four capacitors 339 having respective capacitance values of 4C, 2C, C and C. Capacitors 339 represent the Analog Input 122. The 4C capacitor 339 is connectable to either the analog input or to REF, while the 2C and C capacitors 339 are separately connectable to either the analog input or to ground (GND). The upper plates of all of capacitors 338, 339 are tied together to form Node N, which represents the Continuous-Time Summer. When operations begin, structure 300 is auto-zeroed. To perform auto-zeroing, the DAC code is set to the mid-value, i.e., half of the capacitors 338 are connected to GND, while the other half of capacitors 338 are connected to REF. Assuming that the voltage common mode (VCM) is equal to REF/2, half of capacitors 339 are connected to REF and half of capacitors 339 are connected to REF. In at least one embodiment, 4C capacitor 339 is connected to REF and 2C and C capacitors 339 are connected to GND. At the same time, Switch S2 is closed to connect the upper plate of capacitors 338, 339 to VCM. This configuration ensues that the voltage on Node N is VCM.

During normal operation of structure 300, Switch S2 is opened, so that Node N is free-floating, and each of capacitors 339 are connected to the analog input. If capacitors 338, which represent the DAC, are all set to ground as shown in FIG. 3, then the value of node N will reflect the analog input. As the DAC code is cycled, each new capacitor 338 that is connected to the reference will change the capacitance of the lower plate of capacitors 338 by REF/8. However, since capacitors 338 represent only half of the top plate, the change on Node N is REF/16. As the DAC code is incremented, Node N reflects the value of the analog input minus the DAC code; this value can be taken at midpoint M.

Figure 4:
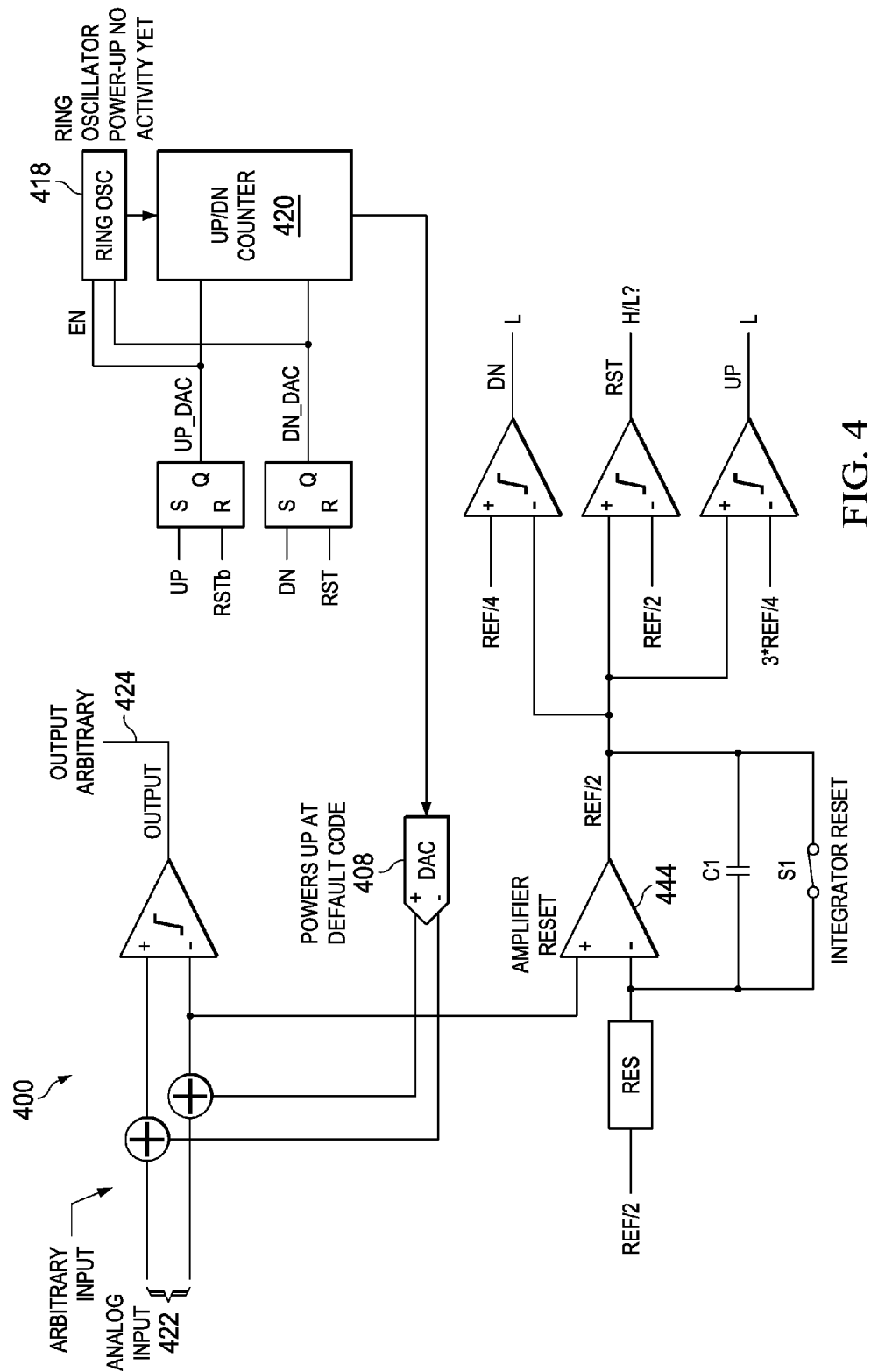
FIG. 4 highlights conditions within the ADC of FIG. 2 at power up.

FIG. 4 illustrates the ADC of FIG. 2 at power up and highlights the initial state of various elements. Initially, both the analog input 422 and the output 424 of ADC 400 are unknown. DAC 408 powers up at a default code. Ring Oscillator 418 powers up, but is not yet active. Amplifier 444 is reset and Switch S1 is closed to reset the integrator formed by Amplifier 444, Capacitor C1 and Switch S1, ensuring that the initial value of the output from the integrator is REF/2. Comparators 448 and 452 each initialize to zero, while the value of Comparator 450 is unknown.

Figure 5:
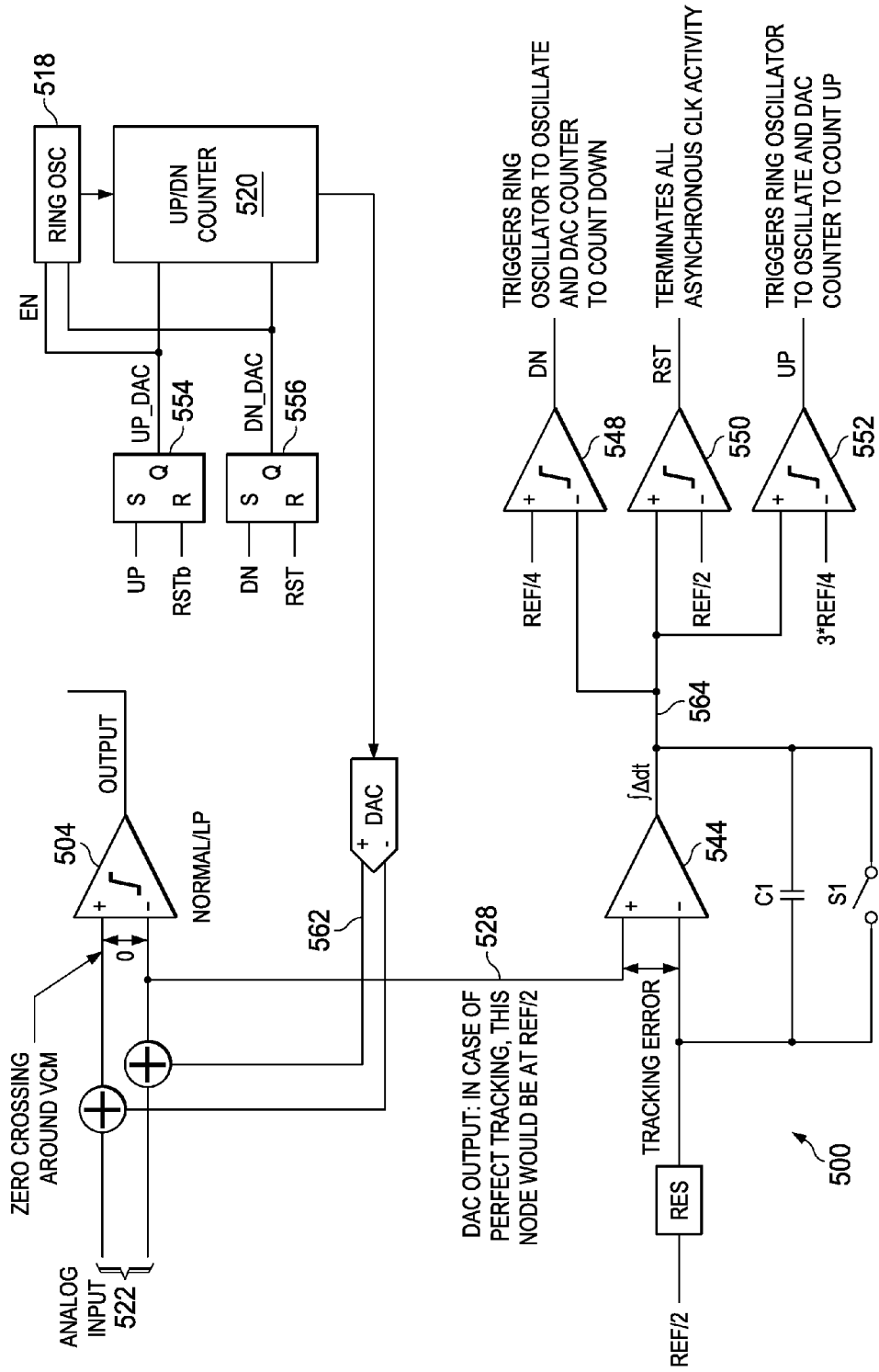
FIG. 5 highlights conditions within the ADC of FIG. 2 during normal operation.

FIG. 5 illustrates the ADC of FIG. 2 during normal operation and highlights the signal values at various locations in the circuit. Notably, in ADC 500, when the difference between the analog differential inputs 522 is zero, the voltage on each of the outputs of Continuous-Time Summer 510 is VCM, i.e. REF/2. Accordingly, error signal 528 would be REF/2 when the DAC code is perfectly tracking the analog input 522. Amplifier 544 is subtracting REF/2 from the signal received on error signal 528, which represents the tracking error. When tracking is perfect, then the output 564 of the integrator is zero, but if a tracking error is present, the output 564 accumulates this error. When the error is large, the cumulative error will quickly trigger either comparator 548 to provide a "1" on signal DN or comparator 552 to provide a "1" on signal UP. When the error is small, the accumulated error takes longer to trigger one of comparators 548, 552. Triggering the DN signal triggers Ring Oscillator 518 to oscillate and the DAC counter to count downward. Similarly, triggering the UP signal triggers Ring Oscillator 518 to oscillate and the DAC counter to count upward. Tracking the accumulated error, rather than the instantaneous error will ensure that Ring Oscillator 518 and UP/DN Counter 520 is triggered on a regular basis, but allows power usage by these modules to drop when the signal is constant or slowly changing.

Figure 5A:
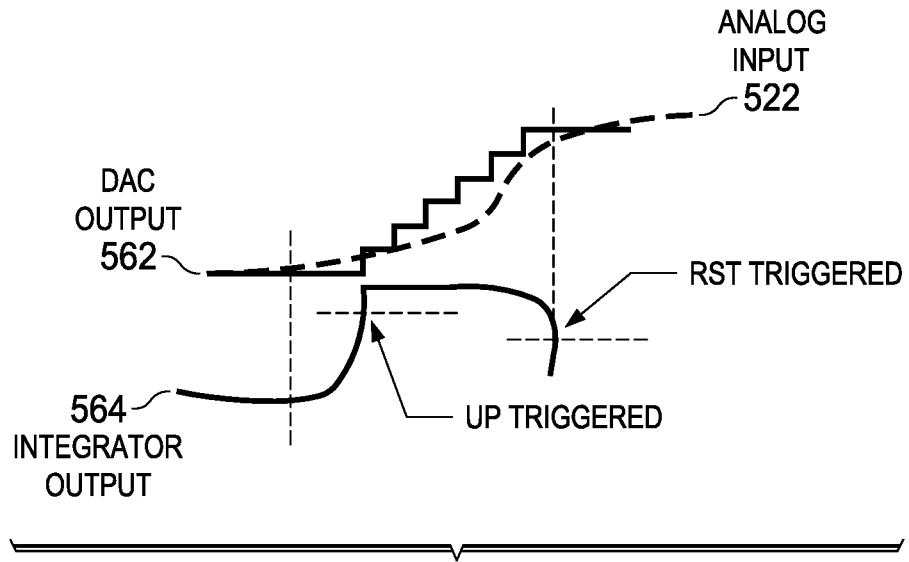
FIGS. 5A and 5B depict various signals associated with the ADC of FIGS. 1 and 2.

FIG. 5A illustrates several of the signals produced during operation of ADC 500, although it should be noted that the signals are for illustration only and are not drawn to scale. In the upper portion of this figure, Analog Input 522 is shown as a dotted line, while DAC Output 562 is shown as a solid line. Integrator Output 564 is shown below the other two signals. Initially, Analog Input 522 has been closely tracking DAC Output 562, although a small error has accumulated over some period of time that is not specifically shown. As Analog Input 522 begins to move upward, Integrator Output 564 begins to rise sharply until the value crosses 3*REF/4, triggering the UP signal. As soon as UP is triggered, Flip-Flop 554 receives this signal and sends an UP_DAC signal to both Ring Oscillator 518 and UP/DN Counter 520, causing the DAC counter to be incremented upwards per Ring Oscillator 518 ticks. DAC output 562 will continue to increment until the Restore Signal RST is triggered. In order for the RST to be triggered, the accumulated error needs to be driven back to REF/2. In this example, the initial DAC voltage was lower than the Analog Input, so the Integrator triggered UP. As the DAC code is incremented, the tracking error crosses zero and slightly overshoots, causing the sign of the instantaneous error to be reversed and the accumulated error to fall until RST is triggered. A second zero crossing occurs after reset as the DAC waits for the Analog input to cross. Thus, as long as Analog Input 522 continues to rise in this example, two zero crossings will occur whenever the DAC is triggered. For both zero crossings, appropriate asynchronous two-tuples are provided as asynchronous output, although as mentioned previously, a particular implementation may determine to ignore the zero crossing while the DAC is moving.

As seen in FIG. 5A, as DAC Output 562 rises, the error reverses sign and Integrator Output 564 stabilizes and then drops. Once the accumulated error drops below REF/2, Comparator 550 triggers the RST signal. When this happens, all asynchronous clock activity is stopped and DAC Output 562 is no longer incremented. The circuit then waits for DAC Output 562 and Analog Input 522 to cross, triggering an asynchronous output. When Analog Input 522 is falling, the same process occurs, except that Integrator Output 564 will cross REF/4, triggering the DN signal. When the DN signal is triggered Flip-Flop 556 receives this signal and sends a DN_DAC signal to both Ring Oscillator 518 and UP/DN Counter 520, causing the DAC counter to be decremented per Ring Oscillator 518 ticks until the RST signal is again triggered.

Figure 5B:
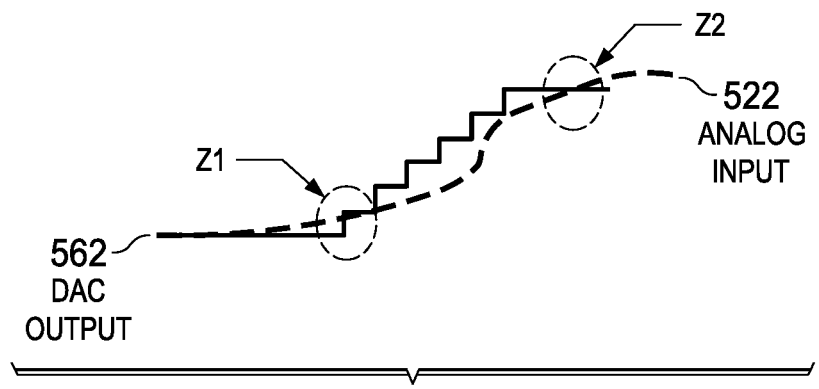

FIG. 5B again shows Analog Input 522 and DAC signal 562, this time to point out several zero crossing points Z1 and Z2. At Z1, the zero crossing occurs when the DAC code is moving. Assuming that the DAC code is changing by one least significant bit (LSB), the net residue should be less than one LSB; hence, this point should be accurate to one LSB. In at least one embodiment of ADC 500, a zero crossing while DAC signal 562 is moving is ignored. At Z2, DAC signal 562 is stable when the zero crossing occurs, triggering an asynchronous conversion and a two-tuple output.

Figure 6:
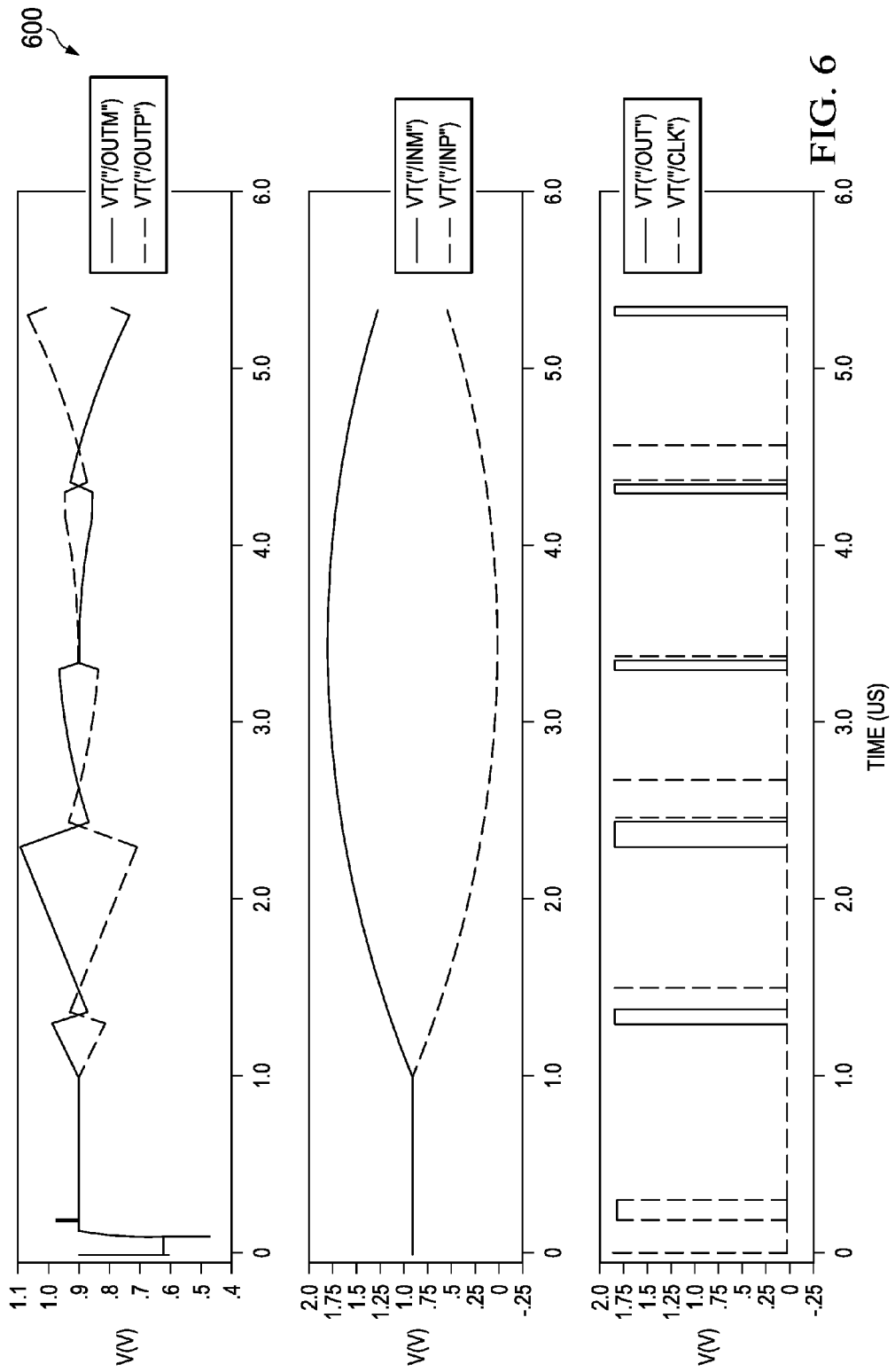
FIG. 6 depicts various signals associated with the ADC of FIG. 2 in a simulation according to an embodiment of the disclosure.

FIG. 6 illustrates various signals of an ADC during a simulation and is explained with reference to FIG. 2. Graph 600 is divided into three sections, upper, middle and lower. The middle section shows Analog Differential Input 222, which in this figure is labeled INM and INP and operates at 100 kHz. The upper section shows differential signals OUTM and OUTP, which are the outputs of Summer 210 and also provide the error signal to Integrator 242. The lower section shows the activity of the clock CLK and output OUT, i.e., Ring Oscillator 218 and Output 124. At time equals 1 millisecond, analog inputs INM and INP begin to move and diverge. At the same time, error signals OUTM and OUTP begin to grow and their value is integrated by Integrator 242. Shortly afterwards, the cumulative error crosses a threshold and triggers the clock CLK, so that Ring Oscillator 218 oscillates and UP/DN Counter 220 increments the DAC code for a period of time. As the DAC code is incremented, it can be seen that the error signal OUTM and OUTP are reversed until the cumulative error reaches REF/2, at which point Comparator 250 triggers reset signal RST and the clock activity ceases. It can be seen that error signals OUTM, OUTP reach zero and overshoot slightly, allowing the DAC activity to cease. OUTM and OUTP have a first zero crossing near the time when the clock signal stops and have a second zero crossing when the DAC is not active; at both points output OUT, i.e., Output signal 224, is triggered. The process is repeated as the analog input signals continue to change. It can be seen that each time the clock is triggered, two zero crossings occur, except when Analog Inputs INM, INP are changing very slowly or reversing direction.

Figure 7:
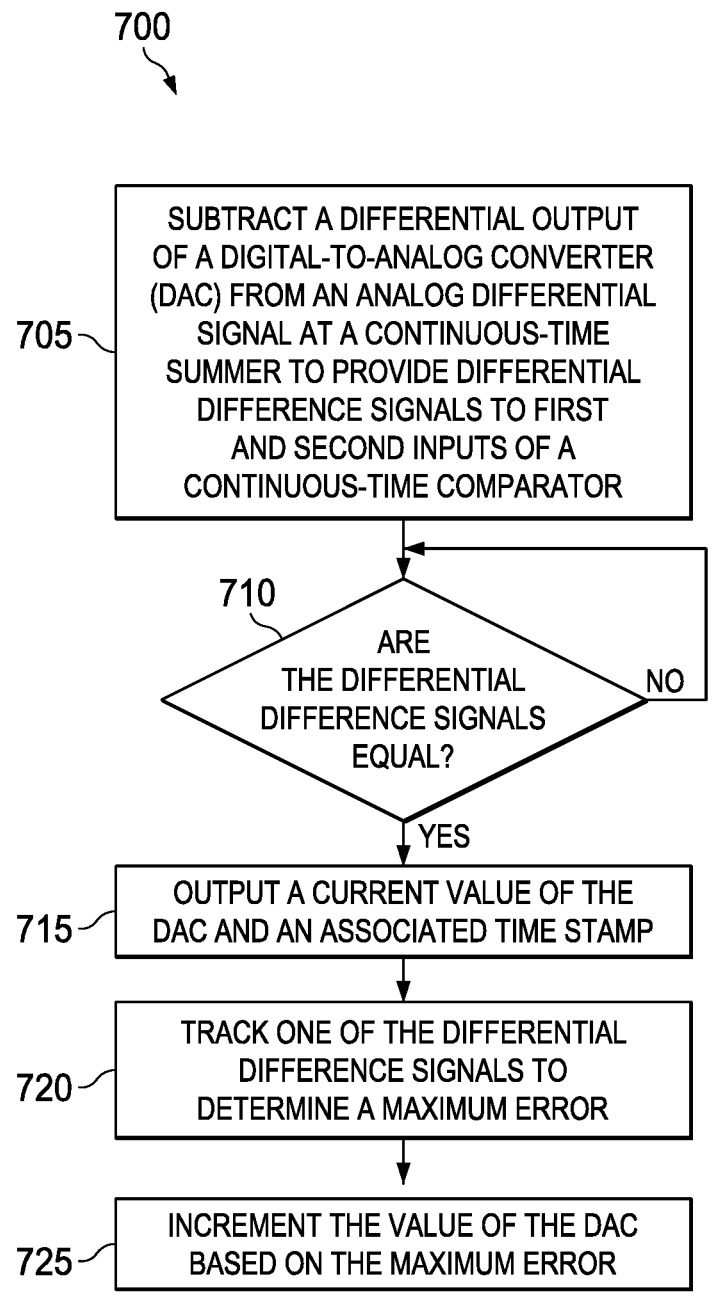
FIG. 7 depicts a method of performing analog-to-digital conversion according to an embodiment of the disclosure.

FIG. 7 is a flowchart that illustrates method 700 of operating an ADC. Initially, the method subtracts (705) a differential output of a digital-to-analog converter (DAC) from an analog differential signal at a continuous-time summer to provide differential difference signals to first and second inputs of a continuous-time comparator. The continuous-time comparator determines (710) whether the differential difference signals are equal. Responsive to the differential difference signals being equal, a current value of the DAC and an associated time stamp are output (715). One of the differential difference signals is tracked (720) to determine a maximum error and the value of the DAC is incremented (725) based on the maximum error.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An asynchronous analog-to-digital converter (AADC) comprising:
   a digital-to analog-converter (DAC);
   a continuous-time comparator that provides an output comprising a digital value of the DAC and a time value; and
   a first and a second continuous-time summer each connected to receive an analog differential input on a first input, to receive a differential output of the DAC on a second input, and to provide a difference between the analog input and the output of the DAC to the continuous-time comparator and to an error estimator that tracks the difference and provides the digital value to the DAC;
   wherein the continuous-time comparator provides the output responsive to the difference between the analog input and the output of the DAC being zero.

2. The AADC as recited in claim 1 further comprising:
   a decision module connected to is receive an error signal from the error estimator; and
   a control logic module connected to receive at least one signal from the decision block and to increment the value of the DAC when activated.

3. The AADC as recited in claim 2 wherein the control logic module comprises:
   an oscillator connected to receive an enable signal from the decision module; and
   an up/down counter module connected to receive an output from the oscillator and a control signal from the decision module and to increment the value of the DAC.

4. The AADC as recited in claim 3 wherein the oscillator is a ring oscillator.

5. The AADC as recited in claim 4 wherein the error estimator comprises an integrator connected to receive the output of the first continuous-time summer and to provide an accumulated error to the decision module.

6. The AADC as recited in claim 5 wherein the decision module comprises:
   a plurality of sub-ranging comparators, each connected to receive the accumulated error on a first input; and
   a first flip-flop and a second flip-flop, each connected to receive at least one signal from the plurality of sub-ranging comparators and to provide an enable signal to the ring oscillator and a control signal to the up/down counter module.

7. The AADC as recited in claim 6 wherein a first sub-ranging comparator of the sub-ranging comparators provides an UP signal to the first flip-flop, a second sub-ranging comparator provides a DOWN signal to the second flip-flop and the third sub-ranging comparator provides a RESET signal to the first flip-flop and the second flip-flop.

8. An asynchronous analog-to-digital converter (AADC) comprising:
   a digital-to analog-converter (DAC);

a continuous-time comparator connected to receive a reference voltage on a first input and to provide an output comprising a digital value of the DAC and a time value; and a continuous-time summer connected to receive an analog input on a first input, to receive an output of the DAC on a second input, and to provide a difference between the analog input and the output of the DAC to a second input of the continuous-time comparator and to an error estimator that tracks the difference and provides the digital value to the DAC;

wherein the continuous-time comparator provides the output responsive to the difference between the analog input and the output of the DAC being zero.

9. The AADC as recited in claim 8 further comprising:

a decision module connected to is receive an error signal from the error estimator; and a control logic module connected to receive at least one signal from the decision block and to increment the value of the DAC when activated.

10. The AADC as recited in claim 9 wherein the control logic module comprises:

an oscillator connected to receive an enable signal from the decision module; and an up/down counter module connected to receive an output from the oscillator and a control signal from the decision module and to increment the value of the DAC.

11. The AADC as recited in claim 10 wherein the oscillator is a ring oscillator.

12. The AADC as recited in claim 11 wherein the error estimator comprises an integrator connected to receive the output of the first continuous-time summer and to provide an accumulated error to the decision module.

13. The AADC as recited in claim 12 wherein the decision module comprises:

a plurality of sub-ranging comparators, each connected to receive the accumulated error on a first input; and a first flip-flop and a second flip-flop, each connected to receive at least one signal from the plurality of sub-ranging comparators and to provide an enable signal to the ring oscillator and a control signal to the up/down counter module.

14. The AADC as recited in claim 13 wherein a first sub-ranging comparator of the sub-ranging comparators provides an UP signal to the first flip-flop, a second sub-ranging comparator provides a DOWN signal to the second flip-flop and the third sub-ranging comparator provides a RESET signal to the first flip-flop and the second flip-flop.

15. The AADC as recited in claim 7 wherein the continuous-time summer and the DAC are embodied in a single structure.

16. A method of operating an asynchronous analog-to-digital converter (AADC), the method comprising:

subtracting a differential output of a digital-to-analog converter (DAC) from an analog differential input signal at a continuous-time summer to provide differential difference signals to first and second inputs of a continuous-time comparator;

determining whether the differential difference signals are equal;

responsive to the differential difference signals being equal, outputting a current value of the DAC and a time stamp;

tracking one of the differential difference signals to determine a maximum error; and incrementing the value of the DAC based on the maximum error.

17. The method as recited in claim 16 wherein tracking one of the differential difference signals comprises integrating the one of the differential difference signals over time.

18. The method as recited in claim 17 wherein incrementing the value of the DAC based on the maximum error comprises responsive to determining that the maximum error has reached an upper threshold, determining to increment the DAC in an upward direction.

19. The method as recited in claim 17 wherein incrementing the value of the DAC based on the maximum error further comprises responsive to determining that the maximum error has reached a lower threshold, determining to increment the DAC in an downward direction.

20. The method as recited in claim 17 wherein incrementing the value of the DAC based on the maximum error further comprises responsive to determining that the maximum error has crossed a midpoint, determining to stop incrementing the DAC.

* * * * *